United States Patent
Zhang et al.

(10) Patent No.: US 10,811,363 B2
(45) Date of Patent: Oct. 20, 2020

(54) MARKS FOR LOCATING PATTERNS IN SEMICONDUCTOR FABRICATION

(71) Applicant: YANGTZE MEMORY TECHNOLOGIES CO., LTD., Wuhan (CN)

(72) Inventors: Dou Dou Zhang, Wuhan (CN); Jin Yu Qiu, Wuhan (CN); Zhi Yang Song, Wuhan (CN); Jun He, Wuhan (CN); Zhi Hu Gao, Wuhan (CN); Yaobin Feng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 15 days.

(21) Appl. No.: 16/354,784

(22) Filed: Mar. 15, 2019

(65) Prior Publication Data
US 2020/0258843 A1    Aug. 13, 2020

Related U.S. Application Data

(63) Continuation of application No. PCT/CN2019/074916, filed on Feb. 13, 2019.

(51) Int. Cl.
*H01L 23/544*   (2006.01)
*H01L 21/78*    (2006.01)

(52) U.S. Cl.
CPC .......... *H01L 23/544* (2013.01); *H01L 21/78* (2013.01); *H01L 2223/54426* (2013.01); *H01L 2223/54493* (2013.01)

(58) Field of Classification Search
None
See application file for complete search history.

(56) References Cited

U.S. PATENT DOCUMENTS

| 4,073,055 | A | * | 2/1978 | Kimura | H01L 21/268 |
| | | | | | 257/E21.238 |
| 6,673,635 | B1 | * | 1/2004 | Hellig | H01L 23/544 |
| | | | | | 257/E21.219 |

(Continued)

FOREIGN PATENT DOCUMENTS

| CN | 1458667 A | 11/2003 |
| CN | 101840886 A | 9/2010 |

(Continued)

OTHER PUBLICATIONS

International Search Report issued in corresponding International Application No. PCT/CN2019/074916, dated Nov. 19, 2019, 4 pages.

(Continued)

*Primary Examiner* — Steven M Christopher
(74) *Attorney, Agent, or Firm* — Bayes PLLC

(57) ABSTRACT

Embodiments of semiconductor fabrication methods are disclosed. In an example, a method for forming a mark for locating patterns in semiconductor fabrication is disclosed. A wafer is divided into a plurality of shots. Each of the plurality of shots includes a semiconductor chip die. Four quarters of a locking corner mark are subsequently patterned, respectively, at four corners of four adjacent shots of the plurality of shots. Each quarter of the locking corner mark is symmetric to adjacent quarters of the locking corner mark and is separated from the adjacent quarters of the locking corner mark by a nominally same distance. The locking corner mark is set as an origin for locating patterns in at least one of the four adjacent shots in semiconductor fabrication.

20 Claims, 8 Drawing Sheets

(56) References Cited

U.S. PATENT DOCUMENTS

| 2011/0115057 A1* | 5/2011 | Harn | ............ | G03F 9/7084 |
| | | | | 257/620 |
| 2015/0014844 A1* | 1/2015 | Wu | ............ | H01L 23/28 |
| | | | | 257/737 |

FOREIGN PATENT DOCUMENTS

| CN | 102097414 A | 6/2011 |
| CN | 103311236 A | 9/2013 |
| CN | 103488063 A | 1/2014 |
| CN | 104934413 A | 9/2015 |
| CN | 107065450 A | 8/2017 |
| CN | 109256376 A | 1/2019 |
| CN | 109324471 A | 2/2019 |
| TW | 201013748 A | 4/2010 |
| TW | 201237990 A | 9/2012 |

OTHER PUBLICATIONS

Written Opinion of the International Searching Authority issued in corresponding International Application No. PCT/CN2019/074916, dated Nov. 19, 2019, 4 pages.

* cited by examiner

408

MARKS FOR LOCATING PATTERNS IN SEMICONDUCTOR FABRICATION

CROSS REFERENCE TO RELATED APPLICATION

This application is continuation of International Application No. PCT/CN2019/074916, filed on Feb. 13, 2019, entitled "MARKS FOR LOCATING PATTERNS IN SEMICONDUCTOR FABRICATION," which is hereby incorporated by reference in its entirety.

BACKGROUND

Embodiments of the present disclosure relate to semiconductor fabrication methods.

In semiconductor fabrication, various types of measurement need to be performed after lithography exposure, including measuring critical dimensions of patterns in the wafer shots using critical dimension scanning electron microscopes (CD-SEM) and measuring overlay offsets between different layers using overlay metrology systems. Thus, a mark with a distinguishable pattern at a specific position in each shot becomes necessary to define a coordinate system of the shot. After lithography exposure and development, the mark can be patterned on the wafer and used as the origin to build up the coordinate system for each shot for subsequent measurements, such as critical dimension measurements and overlay offset measurements.

SUMMARY

Embodiments of semiconductor fabrication methods are disclosed herein.

In one example, a method for forming a mark for locating patterns in semiconductor fabrication is disclosed. A wafer is divided into a plurality of shots. Each of the plurality of shots includes a semiconductor chip die. Four quarters of a locking corner mark are subsequently patterned, respectively, at four corners of four adjacent shots of the plurality of shots. Each quarter of the locking corner mark is symmetric to adjacent quarters of the locking corner mark and is separated from the adjacent quarters of the locking corner mark by a nominally same distance. The locking corner mark is set as an origin for locating patterns in at least one of the four adjacent shots in semiconductor fabrication.

In another example, a method for forming a locking corner mark in semiconductor fabrication is disclosed. A first quarter of the locking corner mark is patterned at a first corner of a first shot of a wafer. After patterning the first quarter of the locking corner mark, a second quarter of the locking corner mark is patterned at a second corner of a second shot of the wafer. The second corner is adjacent to the first corner. The first and second quarters of the locking corner mark are symmetric and separated. Each of the first and second quarters of the locking corner mark includes an array of repetitive patterns.

In still another example, a method for forming a mark for locating patterns in semiconductor fabrication is disclosed. A wafer is divided into a plurality of shots. Four quarters of a locking corner mark are subsequently patterned, respectively, at four corners of four adjacent shots of the plurality of shots. Each quarter of the locking corner mark has an "L" shape and is exposed by only one lithography process. The locking corner mark is set as an origin for locating patterns in at least one of the four adjacent shots in semiconductor fabrication.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
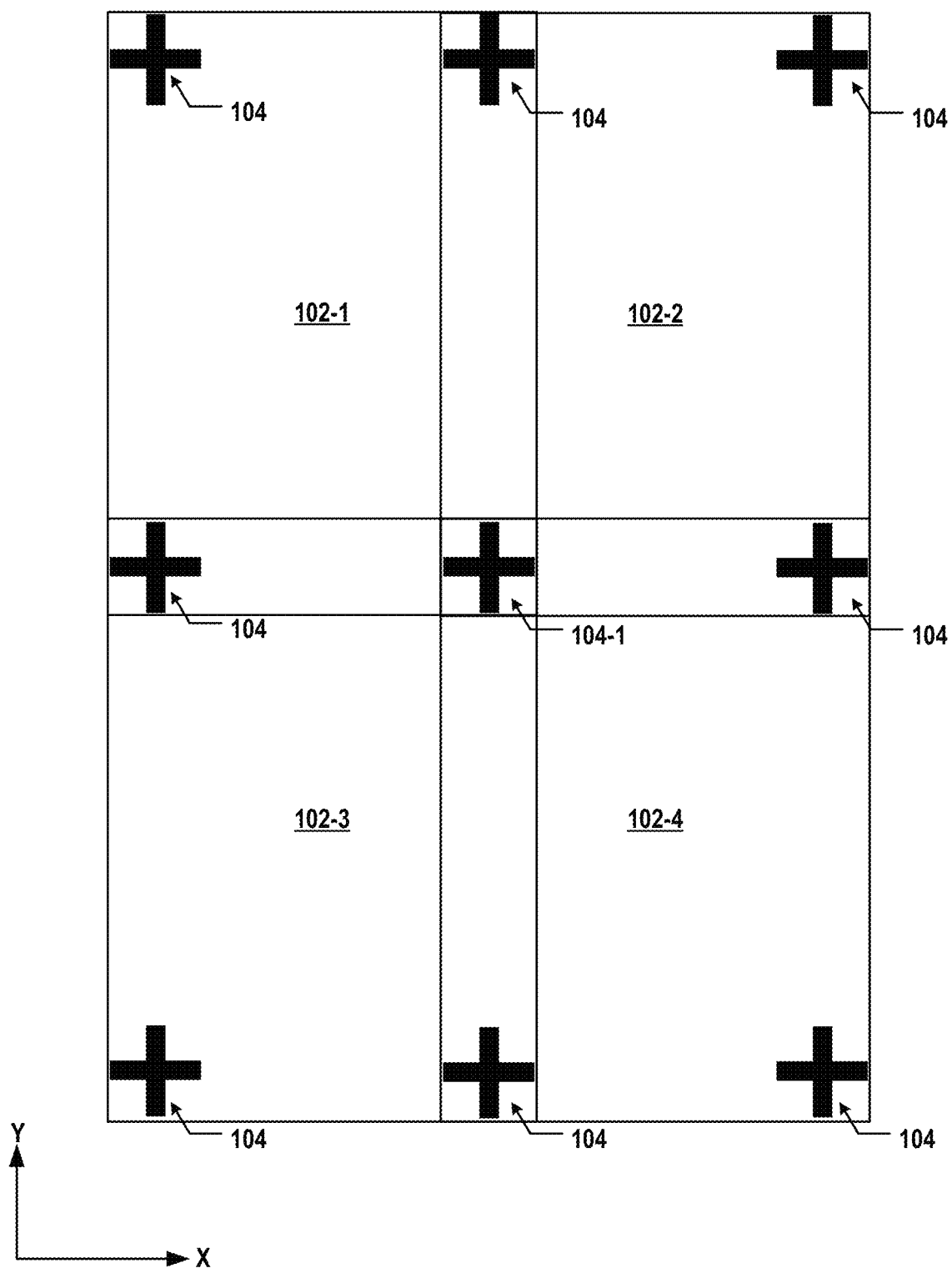
FIG. 1 illustrates a plan view of four adjacent shots of a wafer each having marks for locating patterns in semiconductor fabrication.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating some semiconductor device, such as 3D memory devices, four identical cross-shaped marks are normally patterned at the four corners, respectively, of each shot on a wafer. The mark at the lower-left corner is used as the origin of a coordinate system of the shot for locating and measuring patterns (e.g., device patterns, testing patterns, alignment marks, etc.) during the fabrication processes. For example, FIG. 1 illustrates a plan view of four adjacent shots 102-1, 102-2, 102-3, and 102-4 (collectively referred to as "shorts 102" or individually referred to as "each shot 102") of a wafer each having marks 104 for locating patterns in semiconductor fabrication. For shots 102-1, 102-2, 102-3, and 102-4 shown in FIG. 1, shot 102-1 has an adjacent shot 102-2 in a first direction (x-direction) and another adjacent shot 102-3 in a second direction (y-direction) perpendicular to the first direction. Each shot 102 has a rectangle shape, and each mark 104 has a cross shape. Four marks 104 are patterned at each of the four corners of each shot 102. As patterns (including marks 104) in different shots are patterned by different lithography processes, each mark 104 may be exposed to light by multiple lithography processes when adjacent shots are subsequently patterned. For example, mark 104-1 at the center of four adjacent shots 102-1, 102-2, 102-3, and 102-4 may be exposed four times by four lithography processes.

However, the above-mentioned mark design encounters various deficiencies and limitations. For example, for shots having patterns with small feature sizes (e.g., 100 nm), a mark with line patterns (e.g., having a minimum width of 2 μm) is not allowed to be arranged on the same photomask (also known as "reticle") due to limitations imposed by design rules. In particular, arranging line patterns on the same photomask as contact vias should be avoided because of their significant shape and size differences. Moreover, the repeated exposures to the same mark by multiple lithography processes also increase the merge risk of the patterns of the mark, which can potentially damage the mark, even the size of the patterns can be reduced. Using other patterns on the photomask as the origin for establishing the coordinate system of a shot may also increase the complexity of measurement steps because other patterns are usually less distinguishable than the cross-shaped marks at the corners.

Various embodiments in accordance with the present disclosure provide improved marks for locating and measuring patterns in semiconductor fabrication. In some embodiments, a locking corner mark is divided into four quarters, which are subsequently patterned at four corners of four adjacent shots, respectively, to avoid repeated exposures to any quarter of the locking corner mark by multiple lithography processes, thereby reducing the merge risk of small-sized patterns. Thus, each quarter of the locking corner mark can be further divided into an array of repetitive patterns with a feature size comparable to that of device patterns in the same shot. In some embodiments, the locking corner mark formed by the four separate quarters still has a distinguishable shape, such as the crossed-shape, which can be easily used as the origin for future measurement steps.

Figure 2:
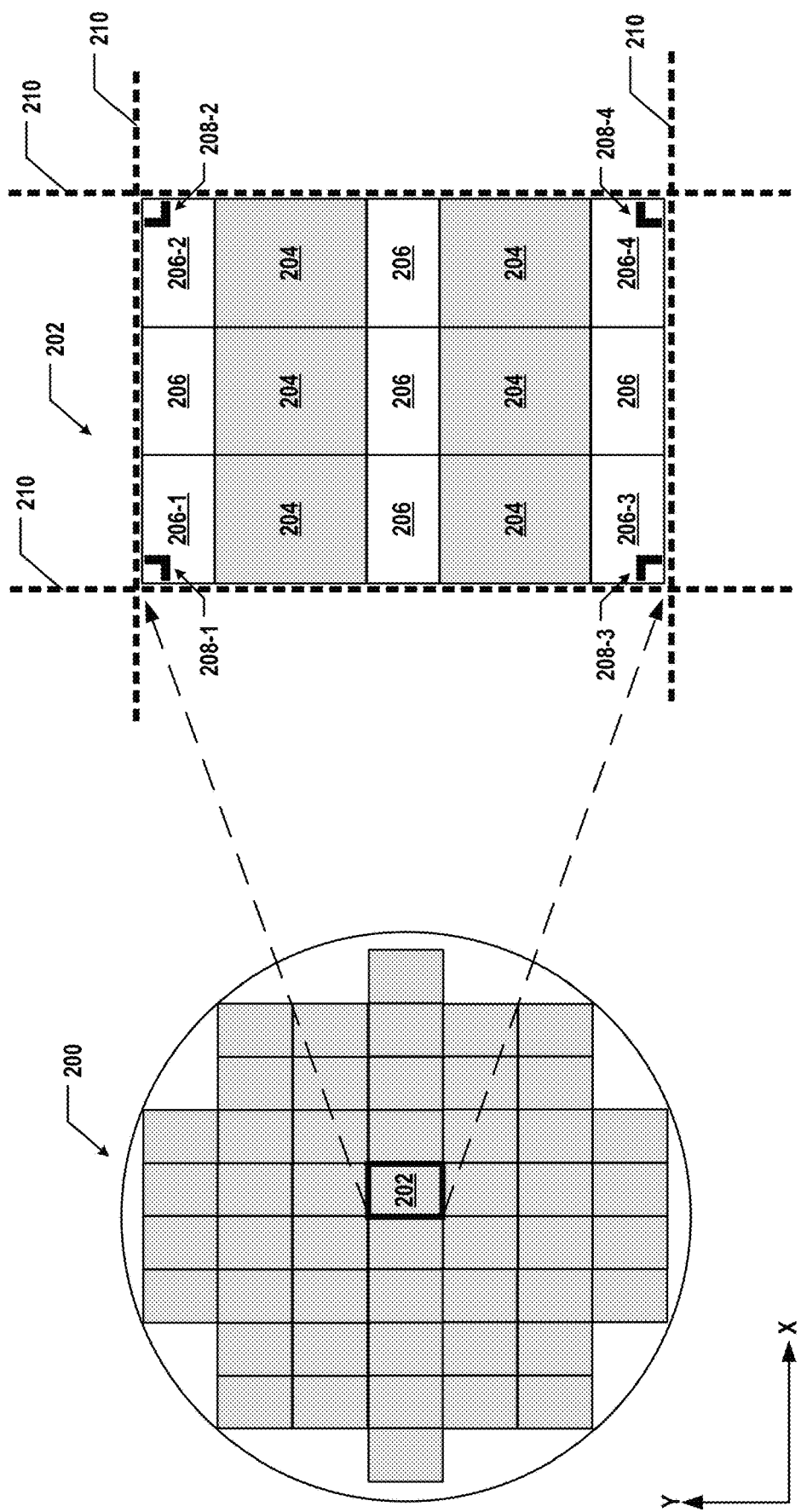
FIG. 2 illustrates a plan view of an exemplary shot of a wafer having four quarter marks for locating patterns in semiconductor fabrication, according to some embodiments of the present disclosure.

FIG. 2 illustrates a plan view of an exemplary shot 202 of a wafer 200 having four quarter marks 208 for locating patterns in semiconductor fabrication, according to some embodiments of the present disclosure. As used herein, a "wafer" is a piece of a semiconductor material for semiconductor devices to build in and/or on it and that can undergo various fabrication processes before being separated into dies. Wafer 200 can include a plurality of shots 202. During the lithography process, each shot 202 located in a grid pattern on wafer 200 is exposed in turn as wafer 200 is stepped back and forth under a lens of a stepper, according to some embodiments. For example, once wafer 200 coated with a photoresist layer and a photomask (not shown) with desired patterns are in place and aligned, the wafer stage of the stepper, which is moved in the x- and y-directions (front to back and left to right) by worm screws or linear motors, carries wafer 200 so that the first of shots 202 to be exposed on it is located below the lens, directly under the photomask. A process program (also known as a "recipe") can determine the length of the exposure, the photomask used, as well as other factors that affect the exposure. Exposed wafer 200 can be eventually moved to a developer where the photoresist on its surface is exposed to developing chemicals that wash away areas of the photoresist, based on whether they were exposed to the light passing through the photomask.

As shown in FIG. 2, each shot 202 can include one or more semiconductor chip dies 204. Each semiconductor chip die 204 is a small block of semiconductor material of wafer 200 on which a given functional circuit (e.g., a semiconductor device) is fabricated. The semiconductor device that can be fabricated on semiconductor chip die 204 can include any suitable logic devices (e.g., central processing unit (CPU), graphic processing unit (GPU), and application processor (AP)), volatile memory devices (e.g., dynamic random-access memory (DRAM) and static random-access memory (SRAM)), non-volatile memory devices (e.g., NAND Flash memory, NOR Flash memory), or any combinations thereof in a 2D, 2.5D, or 3D architecture. Various types of device patterns with different shapes and/or sizes can be formed on semiconductor chip die 204 during different fabrication stages including, but not limited to, implantation areas, interconnect lines, contact vias, channels, trenches, plates, etc.

In some embodiments, each shot 202 further includes process control and monitor (PCM) regions 206 surrounding semiconductor chip dies 204, for example, close to the edges and corners of shot 202. PCM regions 206 can locate in scribing lines 210 in the x- and y-directions along which shot 202 can be diced from wafer 200. In PCM regions 206, various non-functional patterns (in contrast to functional device patterns on semiconductor chip dies 204) can be formed, such as pads for thickness and critical dimension inline monitor, alignment marks for lithography alignment and overlay measurement, test-keys for wafer acceptance test (WAT) and reliability test, etc. At wafer package stage, part or the entirety of PCM regions 206 can be cut off and no longer detectable.

Figure 3:
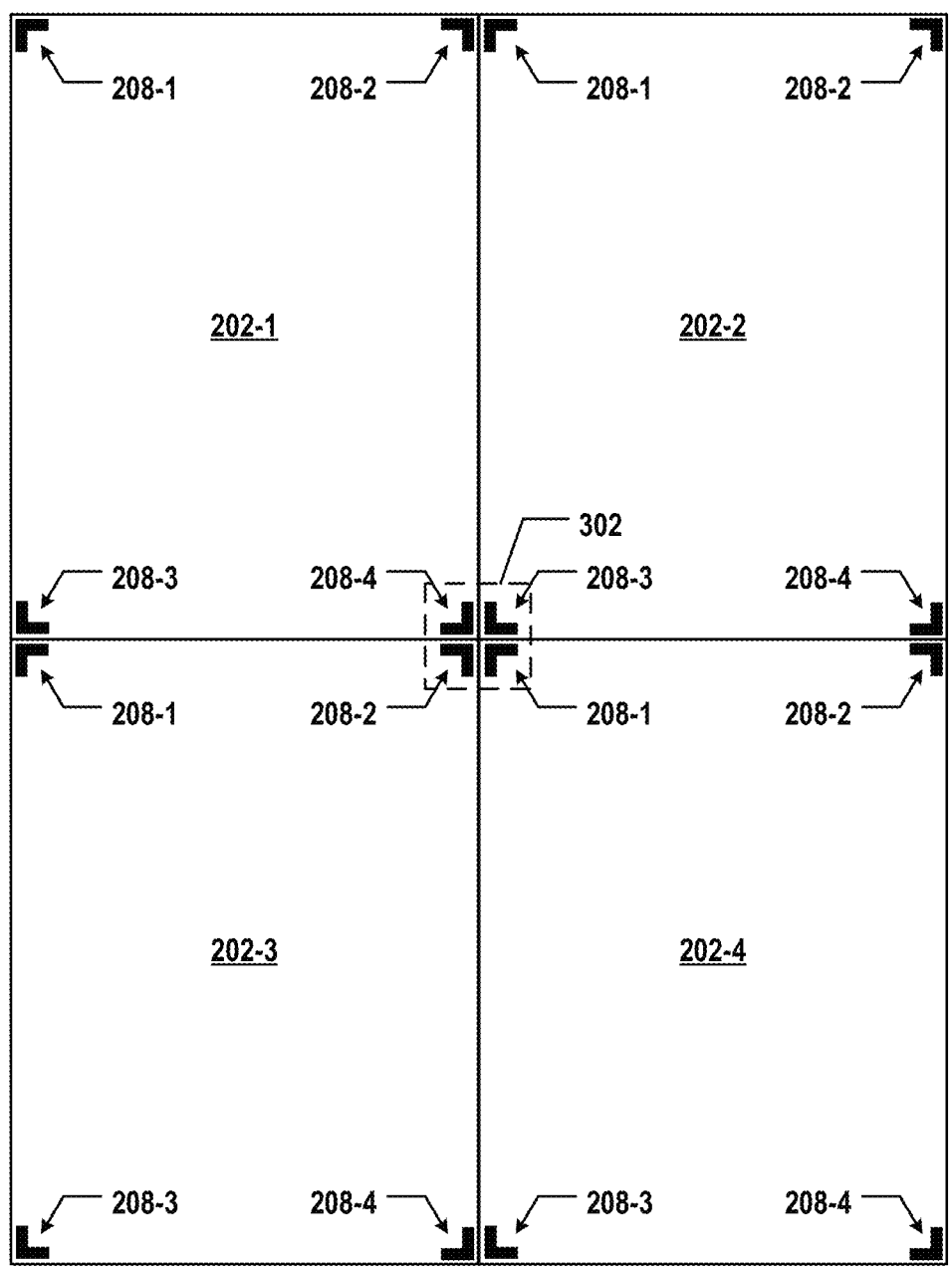
FIG. 3 illustrates a plan view of four adjacent shots each having four exemplary quarter marks for locating patterns in semiconductor fabrication, according to some embodiments of the present disclosure.
Figure 3:
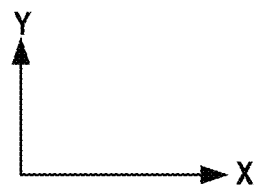

As shown in FIG. 2, each shot 202 can have a rectangle shape with four corners at which four corner PCM regions 206-1, 206-2, 206-3, and 206-4 are located. Four quarter marks 208-1, 208-2, 208-3, and 208-4 are formed in respective corner PCM region 206-1, 206-2, 206-3, and 206-4 at the four corners of shot 202, respectively. As will be described below in detail, instead of having four identical full marks (e.g., 104 in FIG. 1), each quarter mark is a quarter of a full mark for locating patterns in semiconductor fabrication. For example, FIG. 3 illustrates a plan view of four adjacent shots 202-1, 202-2, 202-3, and 202-4 each having four quarter marks 208-1, 208-2, 208-3, and 208-4 (collectively referred to as "quarter marks 208" or individually referred to as "each quarter mark 208") for locating patterns in semiconductor fabrication, according to some embodiments of the present disclosure. Four quarter marks 208-4, 208-3, 208-2, and 208-1 in four adjacent shots 202-1, 202-2, 202-3, and 202-4, respectively, can constitute a full mark 302 at the center of four adjacent shots 202-1, 202-2, 203-3, and 202-4. Since each shot 202 is individually exposed once, each quarter mark 208 will not be over-exposed for multiple times, according to some embodiments. Full mark 302 can be set as the origin for defining a coordinate system (e.g., having x-axis and y-axis) for at least one of four adjacent shots 202-1, 202-2, 202-3, and 202-4 (e.g., upper-right shot 202-2) and locating patterns in corresponding shot 202 in semiconductor fabrication. In some embodiments, four adjacent shots 202-1, 202-2, 202-3, and 202-4 are patterned in scribing lines (in the x-direction and y-direction) and thus, are removed when dicing wafer 200 along the scribing lines to separate four adjacent shots 202-1, 202-2, 202-3, and 202-4 from wafer 200.

Figure 4A:
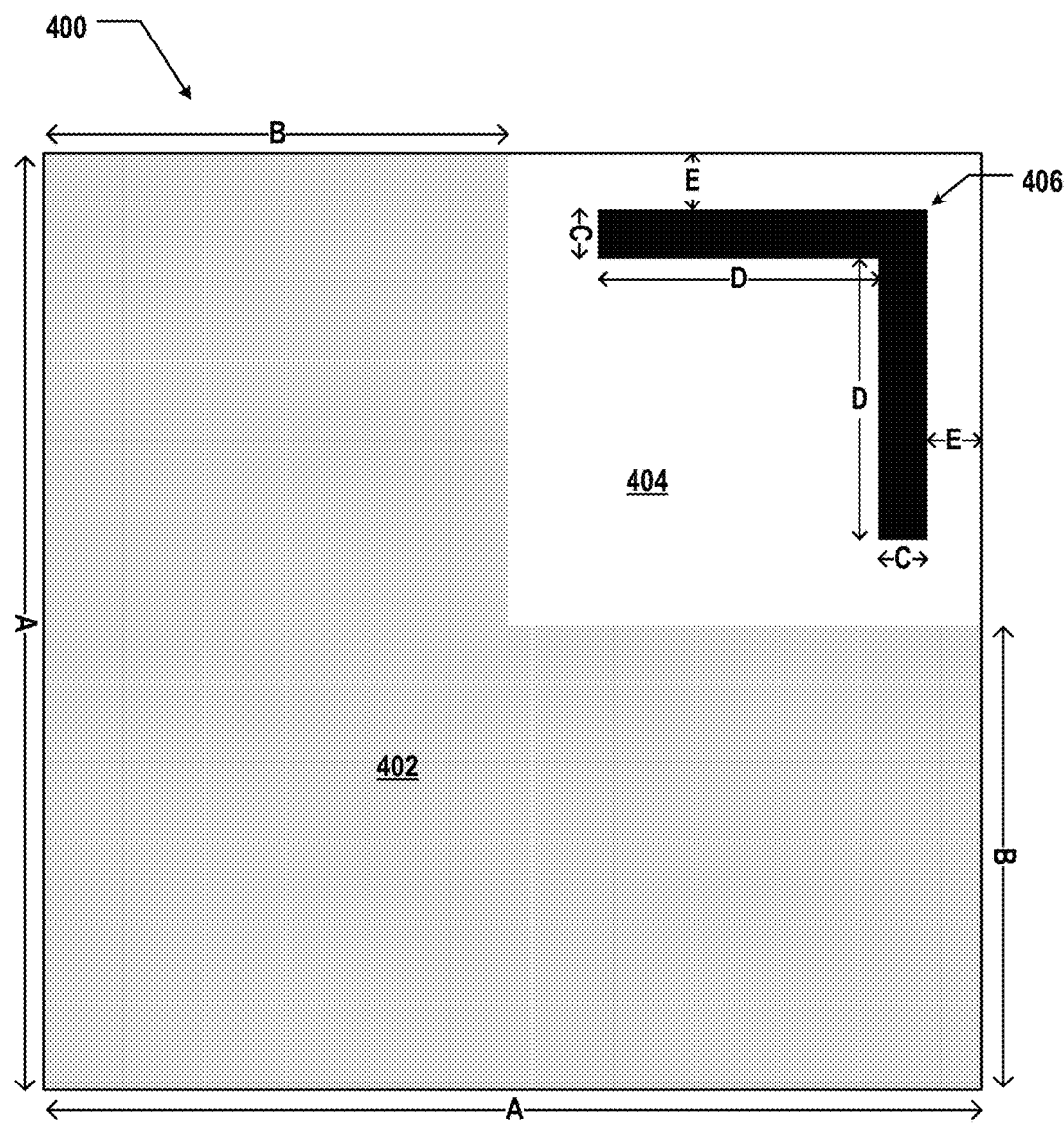
FIG. 4A illustrates a plan view of an exemplary quarter of a locking corner mark in a cell region, according to some embodiments of the present disclosure.

FIG. 4A illustrates a plan view of an exemplary quarter 406 of a locking corner mark (also referred to herein as a "locking corner mark quarter") in a cell region 400, according to some embodiments of the present disclosure. In semiconductor device design, cell regions 400 are the basic units of the layout for arranging patterns. Each cell region 400 can have the same shape and size determined based on the design rules of fabricating the semiconductor device. Locking corner mark quarter 406 is arranged within cell region 400 that is at one of the corners of a shot, according to some embodiments. For example, cell region 400 may have a square shape with each side A of 16.9 μm. As shown in FIG. 4A, cell region 400 can be divided into four sub-regions, each of which has a square shape with each side B of 8.45 μm (i.e., B=A/2), and locking corner mark quarter 406 can be patterned in one of the sub-regions that is at the corner of the shot. For example, for cell region 400 at the upper-right corner of the shot, locking corner mark quarter 406 may be patterned in the upper-right sub-region of cell region 400, as shown in FIG. 4A. During lithography process for patterning locking corner mark quarter 406, the upper-right sub-region in which locking corner mark quarter 406 is to be patterned is exposed to the light (and is referred to herein as an "exposure area 404"), while the remaining sub-regions are prevented from exposure (and are referred to herein as a "non-exposure area 402"). Exposure area 404 is one quarter of the size of cell region 400, according to some embodiments. It is understood that in some embodiments, the side B of exposure area 404 is not half of the side A of cell region 400, and exposure area 404 is not one quarter of the size of cell region 400.

In some embodiments, locking corner mark quarter 406 has an "L" shape having two arms of the same size. It is understood that, locking corner mark quarter 406 can have two arms of different sizes or have other shapes. As will be described below, four "L"-shaped locking corner mark quarters 406 can constitute a cross-shaped locking corner mark when they are patterned in four adjacent shots, respectively. As shown in FIG. 4A, each arm of locking corner mark quarter 406 has a feature width C and a feature length D.

In some embodiments, locking corner mark quarter 406 is a single pattern (e.g., in a continuous, enclosed area). The feature size (e.g., the feature width C) of the single pattern (e.g., the "L"-shaped pattern) of locking corner mark quarter 406 is greater than about 1 μm, such as greater than 1 μm. In some embodiments, the feature size (e.g., the feature width C) of the single pattern is between about 1 μm and about 10 μm, such as between 1 μm and 10 μm (e.g., 1 μm, 2 μm, 3 μm, 4 μm, 5 μm, 6 μm, 7 μm, 8 μm, 9 μm, 10 μm, any range bounded by the lower end by any of these values, or in any range defined by any two of these values). In some embodiments, the feature size of locking corner mark quarter 406 (e.g., the feature width C) is determined based on the feature size of patterns (e.g., device patterns) in the corresponding semiconductor chip die (not shown) of the same shot. The feature size of locking corner mark quarter 406 (e.g., the feature width C) can be about the same as the feature size of the patterns in the corresponding semiconductor chip die. For example, for an implantation photomask, the implantation patterns may have a feature size of about 2 μm, and the feature size of locking corner mark quarter 406 (e.g., the feature width C) may be about 2 μm as well. The feature length D can be between the feature width C and the side B of exposure area 404.

Figure 4B:
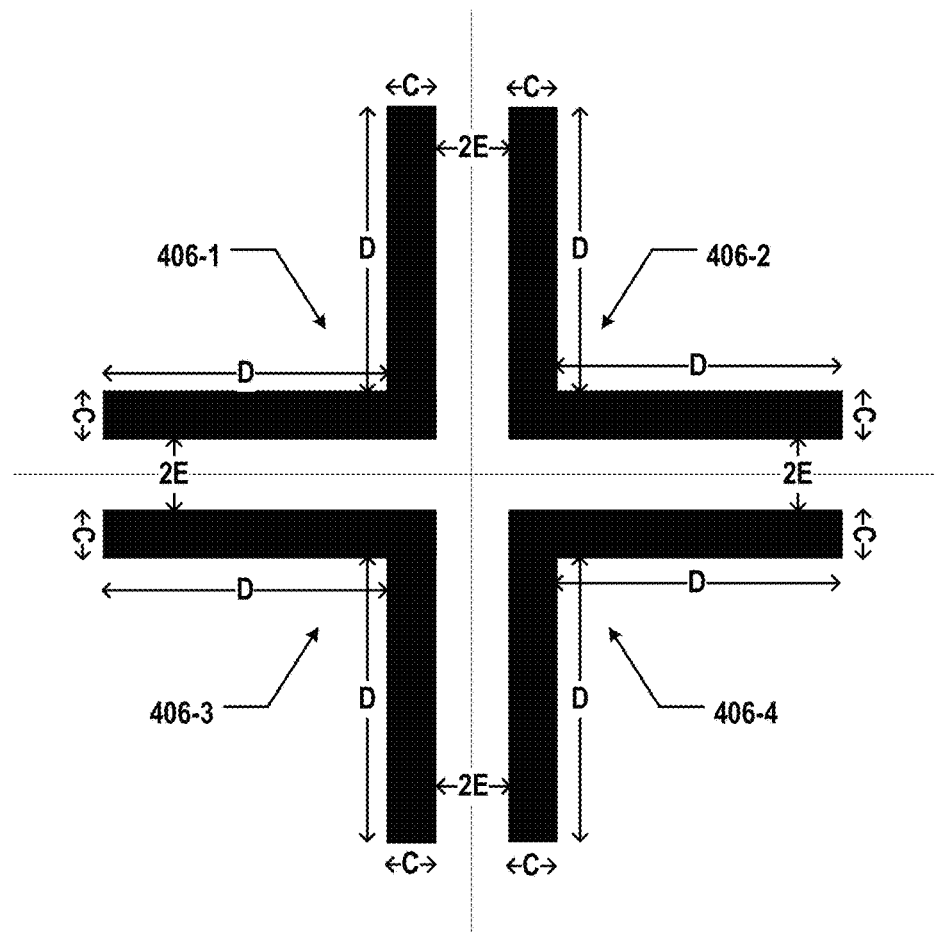
FIG. 4B illustrates a plan view of an exemplary locking corner mark formed by four quarters of the locking corner mark in four adjacent shots, according to some embodiments of the present disclosure.
Figure 4B:

As shown in FIG. 4A, another dimension related to locking corner mark quarter 406 is the distance E from the edge of cell region 400. In some embodiments, the distance E is greater than 0, meaning that there is a margin between locking corner mark quarter 406 and the edge of cell region 400. The margin can prevent the formation of fine photoresist lines on the wafer when an overlay shift occurs between adjacent shots, which can cause photoresist peeling defect. For example, FIG. 4B illustrates a plan view of an exemplary locking corner mark 408 formed by four quarters 406-1, 406-2, 406-3, and 406-4 (collectively referred to as "four quarters 406" or individually referred to as "each locking corner mark quarter 406") of locking corner mark 408 in four adjacent shots, according to some embodiments of the present disclosure. Each locking corner mark quarter 406 is symmetric to adjacent locking corner mark quarters 406 and is separated from its adjacent locking corner mark quarters by a nominally same distance 2E, according to some embodiments. The distance 2E between two adjacent locking corner mark quarters (either in the x-direction or y-direction) can serve as the margin for preventing photoresist peeling defect due to overlay shift.

In some embodiments, first locking corner mark quarter 406-1 is first patterned at the lower-right corner of the upper-left shot, and second locking corner mark quarter 406-2 is then patterned at the lower-left corner of the upper-right shot. The lower-right corner at which first locking corner mark quarter 406-1 is patterned is adjacent to the lower-left corner at which second locking corner mark quarter 406-2 is patterned in the x-direction, according to some embodiments. In some embodiments, third locking corner mark quarter 406-3 is patterned at the upper-right corner of the lower-left shot, and fourth locking corner mark quarter 406-4 is then patterned at the upper-left corner of the lower-right shot. The lower-right corner at which first locking corner mark quarter 406-1 is patterned is adjacent to the upper-right corner at which third locking corner mark quarter 406-3 is patterned in the y-direction, according to some embodiments. The lower-left corner at which second locking corner mark quarter 406-2 is patterned is adjacent to the upper-left corner at which fourth locking corner mark quarter 406-4 is patterned in the y-direction, according to some embodiments. The upper-right corner at which third locking corner mark quarter 406-3 is patterned is adjacent to the upper-right corner at which fourth locking corner mark quarter 406-4 is patterned in the x-direction, according to some embodiments. For any locking corner mark quarter 406, it is symmetric to one adjacent locking corner mark quarter 406 in the x-direction and another adjacent locking corner mark quarter 406 in the y-direction. It is understood that the order of forming four locking corner mark quarters 406-1, 406-2, 406-3, and 406-4 is not limited by the embodiments described above and can be any other suitable order in other embodiments. Nevertheless, once four locking corner mark quarters 406-1, 406-2, 406-3, and 406-4 are patterned, they can constitute locking corner mark 408 having a cross shape at the center of the four adjacent shots.

Figure 5:
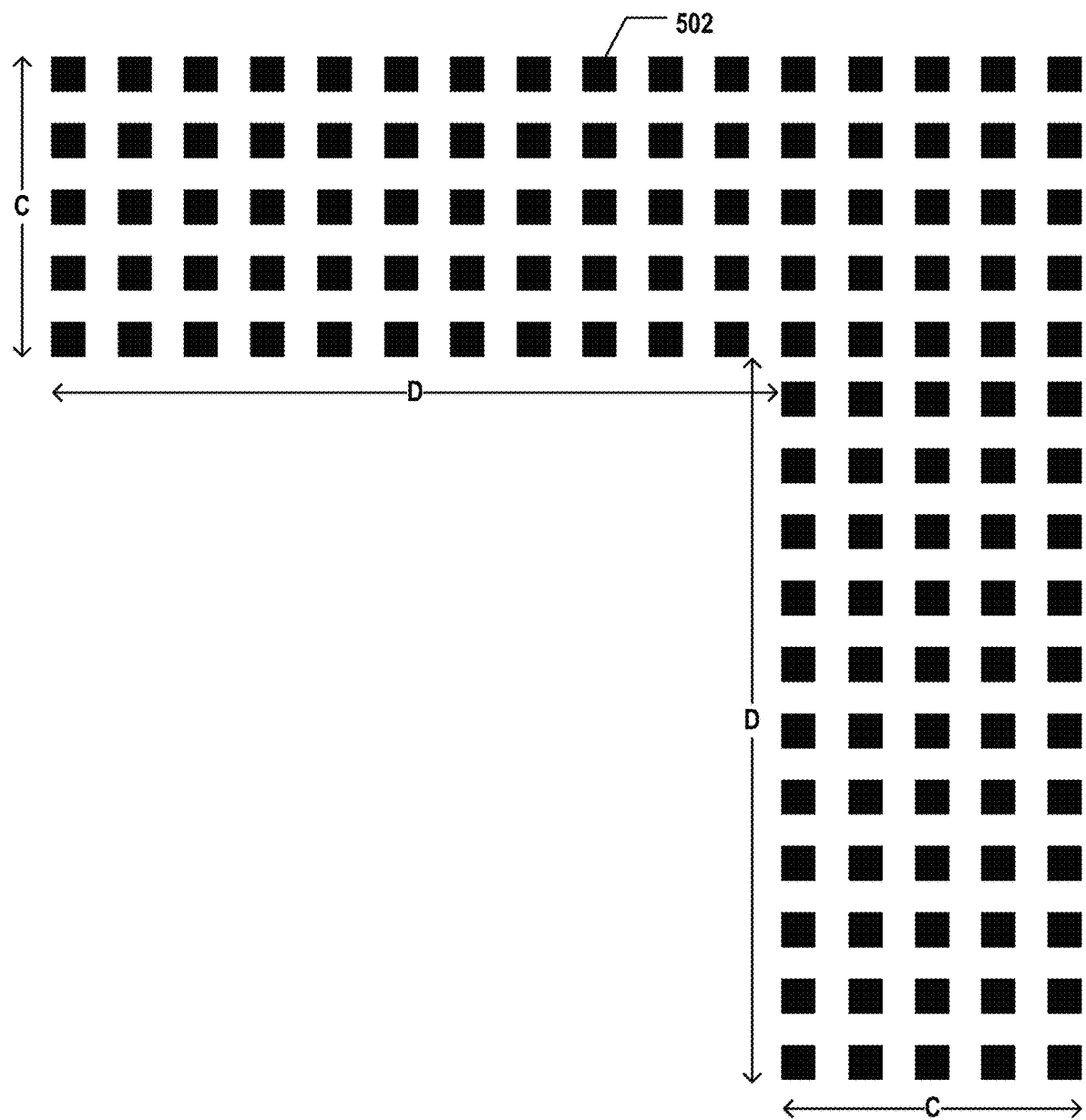
FIG. 5 illustrates a plan view of an exemplary quarter of a locking corner mark including an array of repetitive patterns, according to some embodiments of the present disclosure.

FIG. 5 illustrates a plan view of an exemplary quarter 500 of a locking corner mark including an array of repetitive patterns 502, according to some embodiments of the present disclosure. In some embodiments, instead of having a single pattern (e.g., as shown in FIGS. 4A and 4B), locking corner mark quarter 500 includes an array of repetitive patterns 502 to reduce the pattern feature size of locking corner mark quarter 500. This design can match the pattern feature size of locking corner mark quarter 500 with smaller pattern feature sizes of certain semiconductor chip dies including, but not limited to, semiconductor chip dies on which interconnect lines and contact vias are patterned.

The feature size of each repetitive pattern 502 (e.g., a square-shaped pattern) of locking corner mark quarter 500 is not greater than about 200 nm, such as not greater than 200 nm. In some embodiments, the feature size of each repetitive pattern 502 is between about 20 nm and about 200 nm, such as between 20 nm and 200 nm (e.g., 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, any range bounded by the lower end by any of these values, or in any range defined by any two of these values). In some embodiments, the feature size of each repetitive pattern 502 is determined based on the feature size of patterns (e.g., device patterns) in the corresponding semiconductor chip die (not shown) of the same shot. The feature size of each repetitive pattern 502 can be about the same as the feature size of the patterns in the corresponding semiconductor chip die. For example, for a contact via photomask, the contact via patterns may have a feature size of about 100 nm, and the feature size of each repetitive pattern 502 may be about 100 nm as well.

It is understood that the shape of repetitive patterns 502 is not limited to the square shape as shown in FIG. 5 and can be any other shapes, such as a circle shape, a rectangle shape, etc. In some embodiments, the shape of repetitive patterns 502 is nominally the same as the shape of the device patterns (e.g., circle shape of contact via patterns) in the corresponding semiconductor chip die. By matching the sizes and shapes of repetitive patterns 502 in locking corner mark quarter 500 with the device patterns of the same shot, the same optical proximity correction (OPC) can be applied to repetitive patterns 502 and the device patterns, thereby ensuring the uniformity of pattern quality on the wafer.

Figure 6:
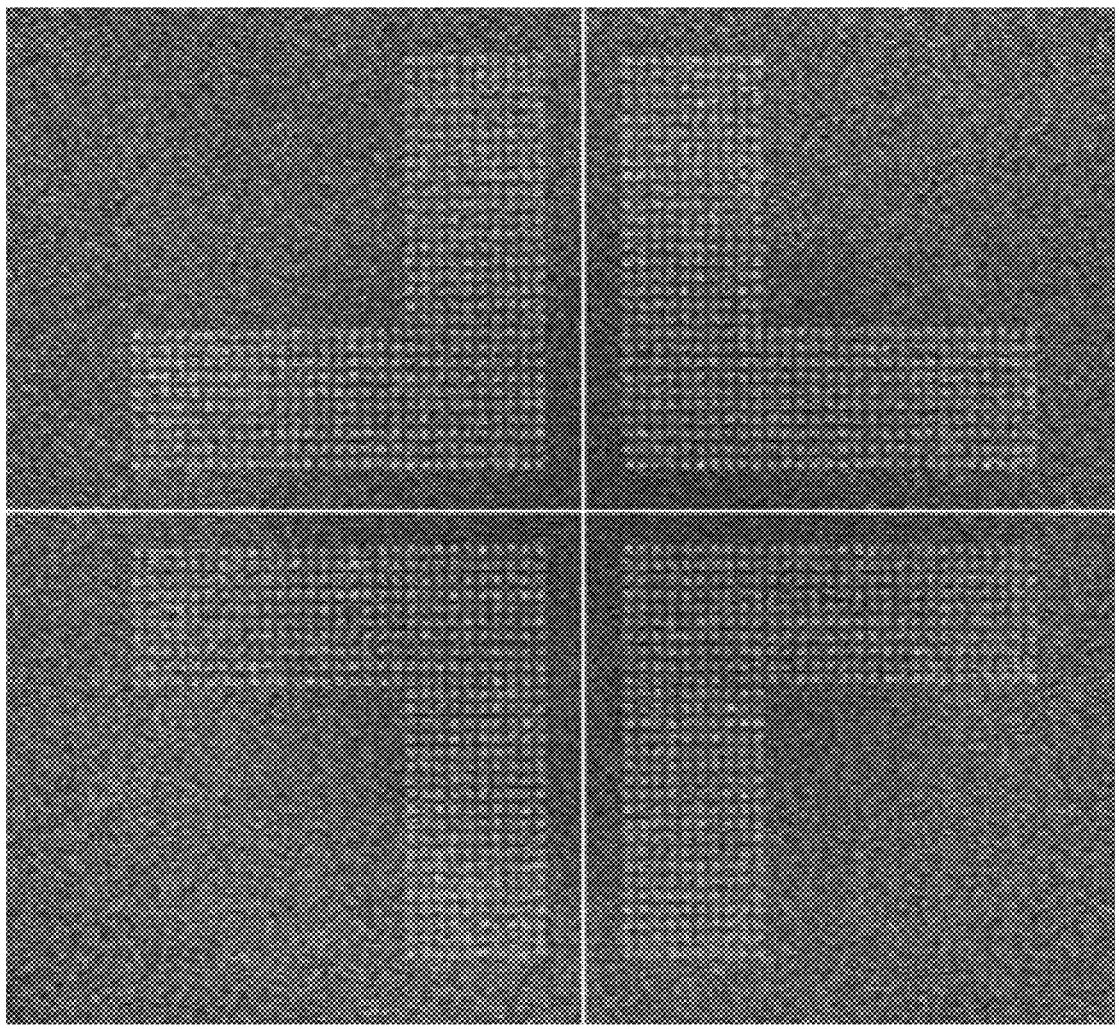
FIG. 6 illustrates an image of an exemplary locking corner mark formed by four quarters of the locking corner marks each including an array of repetitive patterns, according to some embodiments of the present disclosure.

FIG. 6 illustrates an image of an exemplary locking corner mark formed by four quarters of a locking corner marks each including an array of repetitive patterns, according to some embodiments of the present disclosure. As shown in FIG. 6, a cross-shaped locking corner mark is patterned at the center of four adjacent shots, which is formed by four "L"-shaped locking corner mark quarters patterned in the respective shot. Each "L"-shaped locking corner mark quarter is symmetric to two adjacent "L"-shaped locking corner mark quarters in the x-direction and y-direction, respectively. Each "L"-shaped locking corner mark quarter is also separated from the two adjacent "L"-shaped locking corner mark quarters in the x-direction and y-direction, respectively, by the same margin. As each shot includes only a quarter of the full cross-shaped locking corner mark, repeated exposures can be avoided for any "L"-shaped locking corner mark quarter when patterning the full cross-shaped locking corner mark. Moreover, each "L"-shaped locking corner mark quarter includes an array of repetitive patterns to match the feature size and/or shape with the device patterns on the same wafer (not shown).

Figure 7:
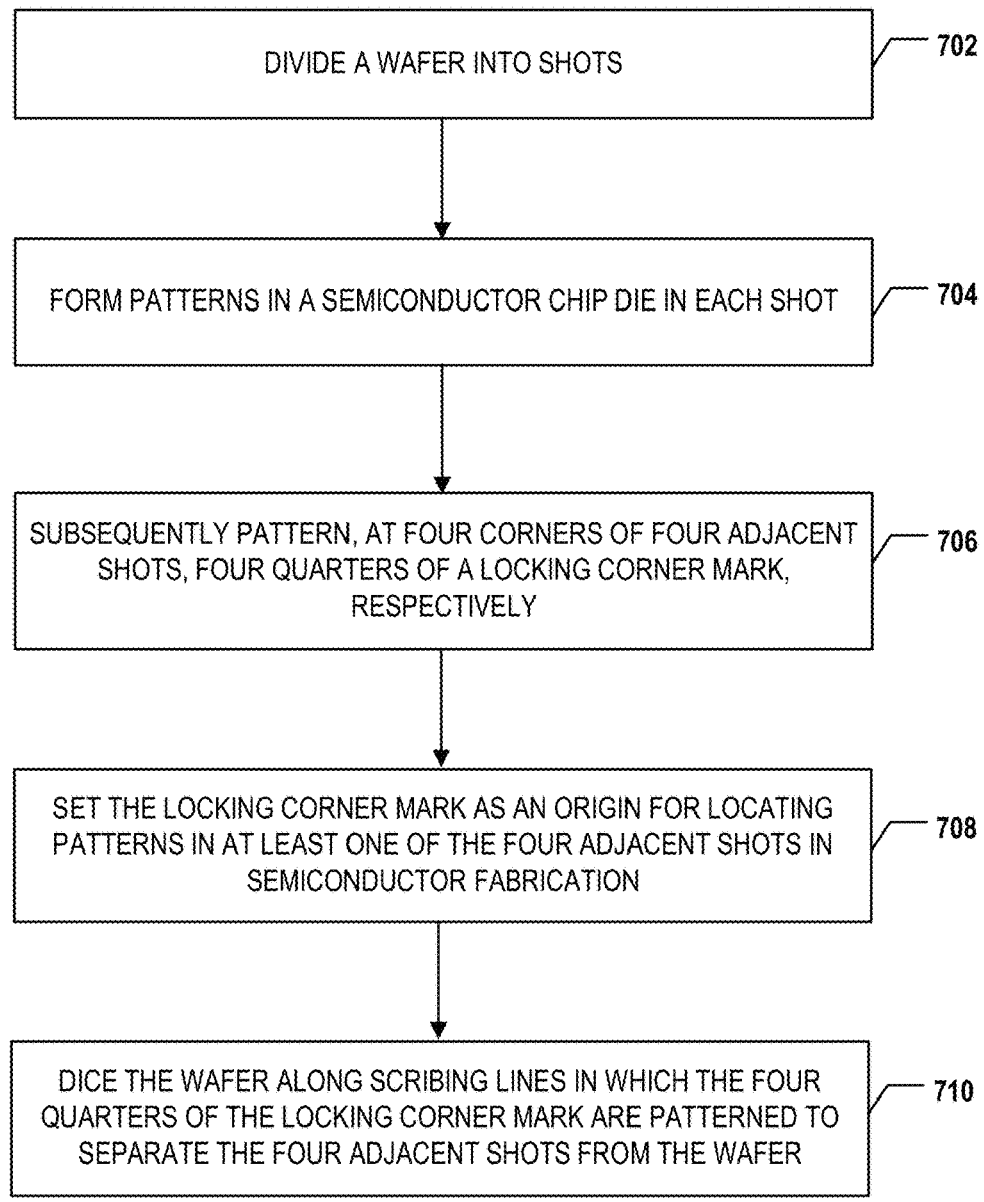
FIG. 7 is a flowchart of an exemplary method for forming a mark for locating patterns in semiconductor fabrication, according to some embodiments of the present disclosure.

FIG. 7 is a flowchart of an exemplary method 700 for forming a mark for locating patterns in semiconductor fabrication, according to some embodiments of the present disclosure. Examples of the mark depicted in FIG. 7 include marks depicted in FIGS. 2, 3, 4A, 4B, and 5. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a wafer is divided into a plurality of shots. Each of the plurality of shots can include a semiconductor chip die. It is understood that the wafer is "divided" with respect to the design layout, as opposed to being physically cut off at operation 702. As illustrated in FIG. 2, wafer 200 is divided into multiple shots 202, each of which includes one or more semiconductor chip dies 204.

Method 700 proceeds to operation 704, in which patterns are formed in a semiconductor chip die in each shot of the wafer. In some embodiments, the patterns in the semiconductor chip die include interconnect lines and contact vias.

Method 700 proceeds to operation 706, in which four quarters of a locking corner mark are subsequently patterned at four corners of four adjacent shots, respectively. In some embodiments, each quarter of the locking corner mark has an "L" shape and is exposed by only one lithography process. In some embodiments, each quarter of the locking corner mark is symmetric to adjacent quarters of the locking corner mark and is separated from the adjacent quarters of the locking corner mark by a nominally same distance. As illustrated in FIG. 4B, each quarter 406 of locking corner mark 408 is symmetric to adjacent quarters 406 of locking corner mark 408 and is separated from adjacent quarters 406 of locking corner mark 408 by the same distance 2E.

In some embodiments, each quarter of the locking corner mark is a single pattern having a feature size that is about the same as a feature size of patterns in the corresponding semiconductor chip die of the same shot. As illustrated in FIG. 4B, each quarter 406 of locking corner mark 408 is a single "L"-shaped pattern. In some embodiments, each quarter of the locking corner mark includes an array of repetitive patterns each having a feature size that is about the same as a feature size of patterns in the corresponding semiconductor chip die of the same shot. As illustrated in FIG. 5, each quarter 500 of the locking corner mark includes an array of repetitive patterns 502.

In some embodiments, each quarter of the locking corner mark is patterned in an exposure area that is one quarter of a cell size of the corresponding shot. As illustrated in FIG. 4A, locking corner mark quarter 406 is patterned in exposure area 404 that is one quarter of the size of cell region 400. To subsequently pattern the four quarters of the locking corner mark, respectively, each of four lithography processes is subsequently applied on a respective one of the four exposure areas, such that each quarter of the locking corner mark is exposed by only one of the four lithography processes.

In some embodiments, a first quarter of the locking corner mark is patterned at a first corner of a first shot of a wafer, and a second quarter of the locking corner mark is patterned at a second corner of a second shot of the wafer after patterning the first quarter of the locking corner mark. The second corner can be adjacent to the first corner. As illustrated in FIG. 4B, first locking corner mark quarter 406-1 is patterned at the lower-right corner of the upper-left shot, and after that, second locking corner mark quarter 406-2 is patterned at the lower-left corner of the upper-right shot. The lower-right corner at which first locking corner mark quarter 406-1 is patterned is adjacent to the lower-left corner at which second locking corner mark quarter 406-2 is patterned in the x-direction. In some embodiments, to pattern the first quarter of the locking corner mark, a first lithography process is applied only on the exposure area in the first shot. In some embodiments, to pattern the second quarter of the locking corner mark, after applying the first lithography process, a second lithography process is applied only on the exposure area in the second shot.

Method 700 proceeds to operation 708, in which the locking corner mark is set as an origin for locating patterns in at least one of the four adjacent shots in semiconductor fabrication. As illustrated in FIG. 3, locking corner mark 302 is at the center of four adjacent shots 202-1, 202-2, 202-3, and 202-4 and can be set as the origin for locating patterns in at least one of four adjacent shots 202-1, 202-2, 202-3, and 202-4, such as upper-right shot 202-2, in semiconductor fabrication.

Method 700 proceeds to operation 710, in which the wafer is diced along scribing lines in which the four quarters of the locking corner mark are patterned to separate the four adjacent shots from the wafer. The locking corner mark thus can be removed from the final semiconductor device. As illustrated in FIG. 2, wafer 200 can be diced along scribing lines 210 in the x-direction and y-direction in which four quarters 208-1, 208-2, 208-3, and 208-4 of the locking corner mark are patterned to separate four adjacent shots 202 from wafer 200.

According to one aspect of the present disclosure, a method for forming a mark for locating patterns in semiconductor fabrication is disclosed. A wafer is divided into a plurality of shots. Each of the plurality of shots includes a semiconductor chip die. Four quarters of a locking corner mark are subsequently patterned, respectively, at four corners of four adjacent shots of the plurality of shots. Each quarter of the locking corner mark is symmetric to adjacent quarters of the locking corner mark and is separated from the adjacent quarters of the locking corner mark by a nominally same distance. The locking corner mark is set as an origin for locating patterns in at least one of the four adjacent shots in semiconductor fabrication.

In some embodiments, each quarter of the locking corner mark has an "L" shape.

In some embodiments, each quarter of the locking corner mark is a single pattern having a feature size that is about the same as a feature size of patterns in the corresponding semiconductor chip die of the same shot. The feature size is greater than about 1 µm, according to some embodiments.

In some embodiments, each quarter of the locking corner mark includes an array of repetitive patterns each having a feature size that is about the same as a feature size of patterns in the corresponding semiconductor chip die of the same shot. The feature size is not greater than about 200 nm, according to some embodiments.

In some embodiments, each quarter of the locking corner mark is patterned in an exposure area that is one quarter of a cell size of the corresponding shot. In some embodiments, to subsequently pattern the four quarters of the locking corner mark, respectively, each of four lithography processes is subsequently applied on a respective one of the four exposure areas, such that each quarter of the locking corner mark is exposed by only one of the four lithography processes.

In some embodiments, the locking corner mark is at a center of the four adjacent shots.

In some embodiments, the wafer is diced along scribing lines in which the four quarters of the locking corner mark are patterned to separate the four adjacent shots from the wafer.

According to another aspect of the present disclosure, a method for forming a locking corner mark in semiconductor fabrication is disclosed. A first quarter of the locking corner mark is patterned at a first corner of a first shot of a wafer. After patterning the first quarter of the locking corner mark, a second quarter of the locking corner mark is patterned at a second corner of a second shot of the wafer. The second corner is adjacent to the first corner. The first and second quarters of the locking corner mark are symmetric and separated. Each of the first and second quarters of the locking corner mark includes an array of repetitive patterns.

In some embodiments, patterns are formed in a semiconductor chip die of the wafer. A feature size of each repetitive pattern in the first and second quarters of the locking corner mark is about the same as a features size of the patterns in the semiconductor chip die. The feature size is not greater than about 200 nm, according to some embodiments. The feature size can be about 100 nm. In some embodiments, the patterns in the semiconductor chip die include interconnect lines and contact vias.

In some embodiments, each of the first and second quarters of the locking corner mark has an "L" shape.

In some embodiments, each of the first and second quarters of the locking corner mark is patterned in an exposure area that is one quarter of a cell size of the corresponding shot. In some embodiments, to pattern the first quarter of the locking corner mark, a first lithography process is applied only on the exposure area in the first shot. In some embodiments, to pattern the second quarter of the locking corner mark, a second lithography process is applied only on the exposure area in the second shot.

In some embodiments, the wafer is diced along scribing lines in which the first and second quarters of the locking corner mark are patterned to separate the four adjacent shots from the wafer.

According to still another aspect of the present disclosure, a method for forming a mark for locating patterns in semiconductor fabrication is disclosed. A wafer is divided into a plurality of shots. Four quarters of a locking corner mark are subsequently patterned, respectively, at four corners of four adjacent shots of the plurality of shots. Each quarter of the locking corner mark has an "L" shape and is exposed by only one lithography process. The locking corner mark is set as an origin for locating patterns in at least one of the four adjacent shots in semiconductor fabrication.

In some embodiments, each quarter of the locking corner mark is symmetric to adjacent quarters of the locking corner mark and is separated from the adjacent quarters of the locking corner mark by a nominally same distance.

In some embodiments, each quarter of the locking corner mark is patterned in an exposure area that is one quarter of a cell size of the corresponding shot.

In some embodiments, the wafer is diced along scribing lines in which the four quarters of the locking corner mark are patterned to separate the four adjacent shots from the wafer.

In some embodiments, patterns are formed in a semiconductor chip die in each of the plurality of shots. In some embodiments, each quarter of the locking corner mark is a single pattern having a feature size that is about the same as a feature size of the patterns in the corresponding semiconductor chip die of the same shot. The feature size is greater than about 1 µm, according to some embodiments. In some embodiments, each quarter of the locking corner mark includes an array of repetitive patterns each having a feature size that is about the same as a feature size of the patterns in the corresponding semiconductor chip die of the same shot. The feature size is not greater than about 200 nm, according to some embodiments.

In some embodiments, the locking corner mark is at a center of the four adjacent shots.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a mark for locating patterns in semiconductor fabrication, comprising:
dividing a wafer into a plurality of shots, wherein each of the plurality of shots comprises a semiconductor chip die;
sequentially patterning, at four corners of four adjacent shots of the plurality of shots, four quarters of a locking corner mark, respectively, wherein each quarter of the locking corner mark is symmetric to adjacent quarters of the locking corner mark and is separated from the adjacent quarters of the locking corner mark by a nominally same distance, wherein the sequentially patterning comprises applying four lithography processes, wherein the four quarters are respectively exposed by a corresponding one of the four lithography processes; and setting the locking corner mark as an origin for locating patterns in at least one of the four adjacent shots in semiconductor fabrication.

2. The method of claim 1, wherein each quarter of the locking corner mark has an "L" shape.

3. The method of claim 1, wherein each quarter of the locking corner mark is a single pattern having a feature size that is about the same as a feature size of patterns in the corresponding semiconductor chip die of the same shot.

4. The method of claim 3, wherein the feature size is greater than about 1 µm.

5. The method of claim 1, wherein each quarter of the locking corner mark comprises an array of repetitive patterns each having a feature size that is about the same as a feature size of patterns in the corresponding semiconductor chip die of the same shot.

6. The method of claim 5, wherein the feature size is not greater than about 200 nm.

7. The method of claim 1, wherein each quarter of the locking corner mark is patterned in an exposure area that is one quarter of a cell size of the corresponding shot.

8. The method of claim 1, wherein the locking corner mark is at a center of the four adjacent shots.

9. The method of claim 1, further comprising dicing the wafer along scribing lines in which the four quarters of the locking corner mark are patterned to separate the four adjacent shots from the wafer.

10. A method for forming a locking corner mark in semiconductor fabrication, comprising:
patterning, at a first corner of a first shot of a wafer, a first quarter of the locking corner mark, and
after patterning the first quarter of the locking corner mark, patterning, at a second corner of a second shot of the wafer, a second quarter of the locking corner mark, the second corner being adjacent to the first corner,
wherein the first and second quarters of the locking corner mark are symmetric and separated, and
each of the first and second quarters of the locking corner mark comprises an array of repetitive patterns.

11. The method of claim 10, further comprising forming patterns in a semiconductor chip die of the wafer, wherein a feature size of each repetitive pattern in the first and second quarters of the locking corner mark is about the same as a features size of the patterns in the semiconductor chip die.

12. The method of claim 11, wherein the feature size is not greater than about 200 nm.

13. The method of claim 12, wherein the feature size is about 100 nm.

14. The method of claim 11, wherein the patterns in the semiconductor chip die comprise interconnect lines and contact vias.

15. The method of claim 10, wherein each of the first and second quarters of the locking corner mark has an "L" shape.

16. The method of claim 10, wherein each of the first and second quarters of the locking corner mark is patterned in an exposure area that is one quarter of a cell size of the corresponding shot.

17. The method of claim 16, wherein:
patterning the first quarter of the locking corner mark comprises applying a first lithography process only on the exposure area in the first shot; and
patterning the second quarter of the locking corner mark comprises, after applying the first lithography process, applying a second lithography process only on the exposure area in the second shot.

18. The method of claim 10, further comprising dicing the wafer along scribing lines in which the first and second quarters of the locking corner mark are patterned to separate the first and second shots from the wafer.

19. A method for forming a mark for locating patterns in semiconductor fabrication, comprising:
dividing a wafer into a plurality of shots;
sequentially patterning, at four corners of four adjacent shots of the plurality of shots in four lithography processes, four quarters of a locking corner mark, respectively, wherein each quarter of the locking corner mark has an "L" shape and is exposed by only one lithography process of the four lithography processes; and
setting the locking corner mark as an origin for locating patterns in at least one of the four adjacent shots in semiconductor fabrication.

20. The method of claim 2, wherein the sequentially patterning comprises, for each quarter of the locking mark, patterning the L-shaped mark by patterning a plurality of separated square-shaped patterns, wherein the separated square-shaped patterns are at least an order of magnitude smaller than the L-shaped mark that they compose.

* * * * *